(12) United States Patent
Goossens et al.

(10) Patent No.: US 8,686,714 B2
(45) Date of Patent: Apr. 1, 2014

(54) ELECTROMECHANICAL TRANSDUCER AND A METHOD OF PROVIDING AN ELECTROMECHANICAL TRANSDUCER

(75) Inventors: Martijn Goossens, Veldhoven (NL); Jozef Thomas Martinus Van Beek, Rosmalen (NL)

(73) Assignee: NXP, B.V., Eindhoven (NL)

(*) Notice: Subject to any disclaimer, the term of this patent is extended or adjusted under 35 U.S.C. 154(b) by 384 days.

(21) Appl. No.: 13/058,114

(22) PCT Filed: Jul. 28, 2009

(86) PCT No.: PCT/IB2009/053271
§ 371 (c)(1),
(2), (4) Date: Apr. 26, 2011

(87) PCT Pub. No.: WO2010/015963
PCT Pub. Date: Feb. 11, 2010

(65) Prior Publication Data
US 2011/0187347 A1    Aug. 4, 2011

(30) Foreign Application Priority Data
Aug. 8, 2008 (EP) .................................. 08104998

(51) Int. Cl.
G01R 29/22 (2006.01)
(52) U.S. Cl.
USPC ........................................................ 324/109
(58) Field of Classification Search
USPC ............... 324/762.01–762.1, 754.01–754.3, 324/755.01–755.11; 257/48; 438/14–18
See application file for complete search history.

(56) References Cited

U.S. PATENT DOCUMENTS

| 5,386,720 A * | 2/1995 | Toda et al. ................. 73/105 |
| 7,554,425 B2 | 6/2009 | Van Beek et al. |
| 7,574,903 B2 * | 8/2009 | Su et al. ..................... 73/105 |
| 7,750,745 B2 | 7/2010 | Van Beek |
| 2009/0060230 A1 | 3/2009 | Kutilainen et al. |

FOREIGN PATENT DOCUMENTS

| CN | 1836464 A | 9/2006 |
| CN | 1849746 A | 10/2006 |
| WO | 2004/053431 A2 | 6/2004 |

OTHER PUBLICATIONS

Melvas, P., et al. "Media Protected Surface Micromachined Leverage beam Pressure Sensor", J. Micromech. & Microeng., vol. 11, No. 6, pp. 617-622 (Nov. 1, 2001).
Beeby, Stephen, et al. "MEMS Mechanical Sensors-Force and Torque Sensors", Artech House, Inc., Norwood, MA, US, pp. 162-164 (2004).
Huang, S., et al. "A High-Performance Micromachined Piezoresistive Accelerometer With Axially Stressed Tiny Beams", J. Micromech. & Microeng., vol. 15, No. 5, pp. 993-1000 (2005).
Bahreyni, B., et al. "Piezoresistive Sensing with Twin-Beam Structures in Standard MEMS Foundry Processes", Sensors and Actuators A 127, No. 2, pp. 325-331 (Mar. 13, 2006).
International Search Report and Written Opinion for Intl Patent Appln. PCT/IB2009/053271 (12-03-20092.

* cited by examiner

Primary Examiner — Tung X Nguyen (57) ABSTRACT

The invention relates to an electromechanical transducer (100). The electromechanical transducer (100) comprises a cantilever beam (101) and an excitation unit (102) that is adapted for exciting a motion of the cantilever beam (101). A detection unit (103) is adapted for detecting an electrical signal (iout) in response to the excited motion of the cantilever beam (101).

14 Claims, 10 Drawing Sheets

Fig. 11

ELECTROMECHANICAL TRANSDUCER AND A METHOD OF PROVIDING AN ELECTROMECHANICAL TRANSDUCER

FIELD OF THE INVENTION

The invention relates to an electromechanical transducer, to an electromechanical transducer system, and to a multiple electromechanical transducer system.

Moreover, the invention relates to a method of providing an electromechanical transducer.

BACKGROUND OF THE INVENTION

Transducers are known that are used for transducing an electrical input voltage, input current or input signal to a desired electrical output signal. Therefore, transducers may receive a source voltage on the basis of which the transducer transforms the input signal to a desired output signal. Preferably, transducers are used in Micro-Electro-Mechanical Systems, also known as (MEMS) systems. Micro-Electro-Mechanical Systems may be denoted as the technology of the very small members, and merges at the nano-scale into nano-electromechanical systems (NEMS) and nanotechnology. MEMS may be made up of components between 1 μm to 100 μm in size and MEMS devices may generally range in size from 20 μm to 1 mm.

Exemplary transducers and electronic devices for such MEMS structures are disclosed in WO 2004/053431, wherein a transducer is disclosed that comprises an electrically conductive resonator element extending in a longitudinal direction having a length. The conductive resonator element can be elastically deformed by an electrically conductive actuator such that the elastic deformation comprises a change of the length. The resonator element is electrically connected to a first contact area and a second contact area thereby constituting a circuit. In this circuit the resonator element constitutes a resistor with an ohmic resistance which is a function of the length. The transducer further comprises a measurement point electrically connected to the circuit for providing an electrical signal which is a function of the resistance. Thereby, silicon resonator is used comprising a piezo-resistive readout.

OBJECT AND SUMMARY OF THE INVENTION

It is an object of the invention to provide an electromechanical transducer with a proper output signal characteristic.

In order to achieve the object defined above, an electromechanical transducer, an electromechanical transducer system, a multiple electromechanical transducer system and a method of providing an electromechanical transducer according to the independent claims are provided.

According to a first exemplary embodiment of the present invention, an electromechanical transducer (for instance configured as a MEMS device) is provided comprising a cantilever beam (for instance a bar being fixed at one end and hanging free at another end opposing the one end, serving as a mechanical resonator), an excitation unit (for instance for mechanically exciting the cantilever to move, particularly to oscillate, in response to the application of an electric excitation signal impacting the cantilever in a contactless manner) and a detection unit. The excitation unit may be adapted for exciting a motion of the cantilever beam (for instance for exciting a mechanic motion of the cantilever in accordance with an electric stimulation signal of the excitation unit). The detection unit may thereby be adapted for detecting an electrical signal (for instance sampled from a fixed end of the cantilever and being characteristic for or even proportional to the motion of the cantilever beam) in response to the excited motion of the cantilever beam.

According to a further exemplary embodiment of the present invention, a method of providing an electromechanical transducer function is provided. A motion of a cantilever beam may be excited, for instance by an excitation unit. Next, an electrical signal may be detected in response to the excited motion of the cantilever beam, for instance by a detection unit.

The term "cantilever beam" may particularly be configured as a physical structure of the field of microelectromechanical systems (MEMS). MEMS cantilevers are fabricated, for instance, from mono- or poly-crystalline silicon. Or other materials, In embodiments, such MEMS cantilevers may be used in radio frequency filters, resonators or oscillators. The term "cantilever beam" may also describe a nanocantilever that may particularly denote that the cantilever beam has at least one dimension in order of magnitude of nm (nanometer) to tens of nm (nanometer) or hundreds of nm (nanometer), or less.

In an embodiment, the cantilever beam may be excited by a certain electric signal (for instance an electric voltage or a voltage distribution) with a certain frequency or frequency distribution, and thereby providing the excited motion (particularly mechanic vibration) of the cantilever preferred at or around a resonance frequency of the cantilever. The excited motion characteristic may depend on the frequency and intensity of the excitation power or the excitation voltage and may thus be a fingerprint of the exciting signal. However, the physical properties (such as length, thickness, stiffness, flexibility) of the cantilever may allow to provide some kind of filter function influencing a characteristic of the properties of the mechanic motion signal. The cantilever beam may comprise a free end and a opposite end at which the cantilever beam is clamped or fixed, for instance by attaching the opposite end to a substrate. Due to the excitation voltage or current provided by the excitation unit (for instance representing a signal to be processed by the transducer), the cantilever beam may rotate or oscillate around the opposite end, and at the free end an excited motion with an amplitude is provided.

The excitation unit may comprise or consist of one or more electrodes adapted for providing an excitation voltage or power to the cantilever beam and thus exciting the motion of the cantilever beam. In particular, the applied excitation voltage provided by the excitation unit may be an AC (alternating current) voltage and may include a frequency contribution close to or at a resonance frequency of the cantilever beam. The electrodes of the excitation unit may comprise copper material. The electrodes may also comprise or consist of gold, aluminium, copper, silicon or the like as well.

The detection unit may be adapted for sensing an output signal, particularly an electric output signal, on the basis of the mechanic movement of the cantilever beam. Thus, for instance, if the excitation unit provides an excitation voltage with a variety of frequencies to the cantilever beam, the cantilever beam may be only excited at and around a resonance frequency representing one of a plurality of excitation voltage frequencies or frequency ranges. Hence, the detection unit may only provide an electrical signal related to the resonance frequency of the cantilever beam. Therefore, the electromechanical transducer may act as some kind of band-pass filter or as an oscillator properly defining a signal supplied to the detection unit.

By using conventional silicon resonators being mechanically fastened at both opposing ends, available input signals, respectively an excitation voltage, may be too low to promote a sufficient motion of the cantilever, so that the output signals may comprise an unsatisfactory quality and quantity. In an embodiment of the invention, in order to obtain a sufficiently strong change in resistance at resonance of the transducer and therefore providing a properly detectable output signal, it may be possible to concentrate the mechanical strain of a cantilever beam at locations where the electrical signals or current is measured by the detection unit. By advantageously using the leverage effect of the cantilever beam, the input signals may be amplified so that an improved output signal quality and a high signal to noise ratio may be provided. In other words, a large excitation amplitude may be provided when using a cantilever beam being mechanically flexible to an adjustable degree and over a broad range by correspondingly setting mechanical dimensions thereof. Thus, the area ratio over which the excitation force may act and through which the cantilever beam is excited may be high and accurate. Furthermore, the output signal may be measured for instance by a piezo-resistive element that may be provided with a good mechanical strain to provide a precise output signal. By using the leverage effect of the cantilever beam, the mechanical strain or the local mechanical strain at the locations of the cantilever beam, where the detection unit measures the output signal, may be improved. Thus, even for low excitation voltages, a sufficient mechanical strain for measuring an output signal may be provided.

Next, further exemplary embodiments of the electromechanical transducer will be explained. However, these embodiments also apply to the electromechanical transducer systems and to the method.

According to a further exemplary embodiment of the invention, the electromechanical transducer further comprises a compressible piezo-resistive element, i.e. a piezo-resistive element adapted to be mechanically compressed upon excitation by the cantilever beam. Additionally or alternatively, one or more compressible piezoelectric elements may be used. The compressible piezo-resistive element may be adapted for clamping the cantilever beam to the detection unit. The cantilever beam may be adapted for compressing the compressible piezo-resistive element due to the excited motion of the cantilever beam, such that the compressible piezo-resistive element provides the electrical signal to the detection unit.

The term "piezo-resistive element" may particularly denote elements that are adapted for providing a piezo-resistive effect. The piezo-resistive effect describes the changing of electrical resistance of a material, i.e. of a piezo-resistive element, due to applied mechanical stress. This is, if the cantilever beam provides an excitation force to the compressible piezo-resistive element, the resistance of the piezo-resistive element may be changed. Thus, when applying a bias voltage through the piezo-resistive element, a current change is measurable due to the changed resistance of the piezo-resistive element. This change in current provides an electrical signal that is based on the bias current and influenced by the changed resistance. Hence the electrical signal is inter alia a function of the excitation voltage and the exited motion. With other words, the electrical signal represents a defined movement of the cantilever beam.

According to a further exemplary embodiment of the electromechanical transducer, a stretchable (or expandable) piezo-resistive element is provided. Additionally or alternatively, one or more stretchable piezoelectric elements may be used. The stretchable piezo-resistive element may be adapted for clamping the cantilever beam to the detection unit. The cantilever beam may be adapted for stretching the stretchable piezo-resistive element due to the excited motion of the cantilever beam such that the stretchable piezo-resistive element provides the electrical signal to the detection unit. When stretching the stretchable piezo-resistive element by the cantilever beam, the resistance of the piezo-resistive element may be changed, so that for instance current that flows through the piezo-resistive element is changed by the changed resistance of the piezo-resistive element, so that an electrical signal may be measured by the detection unit. The electrical signal may thereby be dependent on the movement of the excited motion of the cantilever beam.

By applying compressible piezo-resistive elements and/or stretchable piezo-resistive elements, a variety of designs are made possible, i.e. piezo-resistive elements may be placed to preferred portions of the cantilever beam. Depending on the location of a rotary axis of the cantilever beam the piezo-resistive elements may be stretched or compressed due to the excited motion of the cantilever beam. By using stretchable or compressible piezo-resistive elements, there is no restriction to the location of the piezo-resistive element with respect to the cantilever beam, in particular the rotary axis of the cantilever beam may be adjusted. In one and the same embodiment, a piezo-resistive element may be compressible and/or stretchable depending on the direction of the exited motion of the cantilever beam.

According to a further exemplary embodiment of the electromechanical transducer, the excitation unit may comprise an excitation area (such as one or more excitation electrodes), wherein the excitation area may be adapted for applying an excitation voltage over an excitation gap (which may space the excitation area and the cantilever beam) to impact the cantilever beam. The excited motion of the cantilever beam may be caused when a frequency or a frequency component of the excitation voltage complies with the resonance of the cantilever beam. Thus, by properly dimensioning and locating the excitation area, a higher excitation force may be applied to the cantilever beam, so that the exited motion and thus the reaction force may be amplified.

According to a further exemplary embodiment of the electromechanical transducer, the cantilever beam may comprise a leverage portion extending from a rotary axis of the cantilever beam to a first end of the cantilever beam. The excitation voltage may be applied to impact the leverage portion and therefore generating a resulting excitation force to the cantilever beam. A resulting point of application (or working point) of the excitation force is provided at an excitation distance with respect to the rotary axis. When raising the excitation distance to the rotary axis, the lever arm may be elongated so that the excitation force may be small in an excitation distance to the rotary axis but may be strong in the area of or close to the rotary axis. Thus, even if the excitation voltage is low and therefore produces a small excitation force in a farther point of application to the rotary axis, the excitation force may be still strong enough in the area of the rotary axis to produce an output signal or electrical signal due to the small leverage arm with respect to the rotary axis. Thus, even when applying a small excitation voltage, a sufficient excitation force may be transmitted to the detection unit for generating an electrical signal.

According to a further exemplary embodiment of the electromechanical transducer, the compressible piezo-resistive element may be provided at a first distance to the rotary axis of the cantilever beam. The excitation distance and the first distance may extend in an equivalent (that is particularly in the same) direction along the leverage portion. The excitation distance may be greater than the first distance. Therefore, if the excitation distance is greater than the first distance an amplifying of the excitation force at the location where the excited motion or the resonance of the cantilever beam is sensed may be amplified. Thus, even when a small excitation voltage is applied to the leverage portion a sufficient excitation force may be provided at the region where the detection unit generates the electrical signal.

According to a further exemplary embodiment of the electromechanical transducer, the stretchable piezo-resistive element may be provided at a second distance to the rotary axis. The excitation distance and the second distance may extend in a different direction along the leverage portion. The excitation distance may be greater than the second distance. This is, that the rotary axis may be located between the stretchable piezo-resistive element and the resulting point of application of the excitation force. Thus, the excitation force in the excitation area may cause a stretching of the stretchable piezo-resistive element. If the stretchable piezo-resistive element is located closer to the rotary axis than the point of application of the excitation force, the excitation force that acts at the stretchable piezo-resistive element is amplified by the different distances or leverage arms.

According to a further exemplary embodiment of the electromechanical transducer, the detection unit may comprise a first anchor element and a second anchor element. The first anchor element and the second anchor element may be arranged in such a way that an anchor gap is provided between the first anchor element and the second anchor element, for instance to electrically decouple the anchor elements from one another. The compressible piezo-resistive element may be attached to the first anchor element. The stretchable piezo-resistive element may be attached to the second anchor element. If the first anchor element and the second anchor element are connected by the compressible piezo-resistive element and the stretchable piezo-resistive element, respectively, a bias current may be applied. The anchor gap separates the first anchor element and the second anchor element, so that the current may flow starting from the first anchor element to the second anchor element, wherein the ohmic resistance is defined by the piezo-resistive elements. Hence, due to the resistance changes of the compressible and stretchable piezo-resistive element in response to a cantilever motion, the electric configuration is changed and therefore a corresponding electrical signal is provided. Thus, the electrical signal is based on the movement of the cantilever beam and furthermore based on the excitation voltage.

According to a further exemplary embodiment of the electromechanical transducer, the compressible piezo-resistive element and/or the stretchable piezo-resistive elements is/are made of semiconductor materials selected from the group consisting of n-type doped materials, p-type doped materials, $p^{++}$ doped materials and $n^{--}$ doped materials. Thus, when varying the type and/or concentration of a doping of the piezo-resistive element, the sign and magnitude of the piezo-resistive effect can be modified and optimized.

According to a further exemplary embodiment of the present invention, the excitation gap provides an inconstant (or spatially dependent) spacing between the length of the cantilever beam and the excitation area. Thus, when the spacing of the excitation gap decreases towards the rotary axis respectively when the distance in the direction to the first end of the cantilever beam is increased, then the cantilever beam may provide a larger excited motion without contacting the excitation unit respectively the excitation area. Thus, a larger mechanical amplitude of the cantilever beam respectively of the excited motion may be possible without the need of providing a larger excitation gap over the whole exciting area.

According to a further exemplary embodiment of the invention, the electromechanical transducer comprises at least one of a plurality of compressible piezo-resistive elements and a plurality of stretchable piezo-resistive elements. Thus, if one compressible piezo-resistive element or one stretchable piezo-resistive element is damaged, other piezo-resistive elements may be still operating so that a redundancy is provided for the whole system. Furthermore, the electrical signal may be measured more accurately when providing a plurality of piezo-resistive elements.

According to another exemplary embodiment of the invention, an electromechanical transducer system is provided wherein the transducer system comprises a first electromechanical transducer having the above mentioned properties and a second electromechanical transducer having the above mentioned properties. The exciting motion of a first cantilever beam of the first electromechanical transducer and the exciting motion of a second cantilever beam of the second electromechanical transducer is a rotary motion around a common rotary axis. Thus, each of the first and second cantilever beams may comprise a free end on the farthermost distance to the rotary axis. To a portion of the free ends of the first and second cantilever beams first and second excitation devices, e.g. electrodes, may be provided. Furthermore, on the free ends, electrodes to opposed sides of the first and second cantilever beams may be provided Therefore, the overall energy for exciting the first and second cantilever beams may be reduced. With other words, by combining the electromechanical transducers as described above it is possible that both cantilever beams of the electromechanical transducers rotate around one common rotary axis. Thus, for instance a larger excitation distance may be provided because starting from a rotary axis, the cantilever beams may extend in both directions starting from the rotary axis. This embodiment works best when one of the piezo-resistive elements is p-type and the other n-type.

According to a further exemplary embodiment of the present invention a multiple electromechanical transducer system is provided. The multiple electromechanical transducer system may comprise a first electromechanical transducer system having the above mentioned properties and a second electromechanical transducer system having the above mentioned properties. The first electromechanical transducers of each of the first electromechanical transducer system and the second electromechanical transducer system may comprise a first common or shared excitation unit and a first common or shared detection unit. The second electromechanical transducers of the first electromechanical transducer system and the second electromechanical transducer system may comprise a second common or shared excitation unit and a second common or shared detection unit.

By using a first common excitation unit and a first common detection unit for the first electromechanical transducers, simplified driving electronics and a lower driving excitation voltage may be sufficient for providing an electrical signal to be measured.

According to a further exemplary embodiment of the multiple transducer system, the compressible piezo-resistive elements of the first cantilever beams of the first electromechanical transducer system and the second electromechanical transducer system and the stretchable piezo-resistive elements of the second cantilever beams of the first electromechanical transducer system and the second electromechanical transducer system are doped differently.

Thus, the excited motion is in opposite direction between the first and second cantilever beams of the first electromechanical transducer system and the second electromechanical transducer systems, although one and the same excitation voltage may be applied. The excitation voltage may be applied to the various terminals, such as the excitation devices comprising i.e. electrodes or the like. Thus, the piezo-resistive elements of the first common detection units may be compressed and the piezo-resistive elements of the second common detection units may be stretched. When changing the direction of the excited motion, the compressible piezo-resistive elements of the first cantilever beams are stretched and the stretchable piezo-resistive elements of the second cantilever beams are compressed. Thus, the leverage effect may be amplified. Also the amplifying factor of the excitation voltage to the electrical signal may be amplified.

Embodiments of the invention are not bound to specific materials, so that many different materials may be used. For conductive structures, it may be possible to use metallization structures, silicide structures or polysilicon structures. For semiconductor regions or components crystalline silicon or polysilicon may be used. For insulating portions, silicon oxide or silicon nitride may be used.

In an embodiment, the electromechanical transducer may be monolithically integrated, for instance in semiconductor technology, more particularly in silicon technology.

The aspects defined above and further aspects of the invention are apparent from the examples of embodiment to be described hereinafter and are explained with reference to these examples of embodiment. The exemplary embodiments described for the electromechanical transducer and electromechanical transducer systems may also be applied to exemplary embodiments of the method and vice versa.

BRIEF DESCRIPTION OF THE DRAWINGS

In the following, exemplary embodiments of the present invention will be specified for further explanation and for a better understanding with reference to the attached drawings.

FIG. 2a illustrates a schematical view of a mechanical equivalent diagram of the exemplary embodiment of FIG. 1a;

DESCRIPTION OF EMBODIMENTS

The illustrations in the drawings are schematical. In different drawings, similar or identical elements are provided with the same reference signs. The view in the figures is schematical and not fully scaled.

Figure 1:
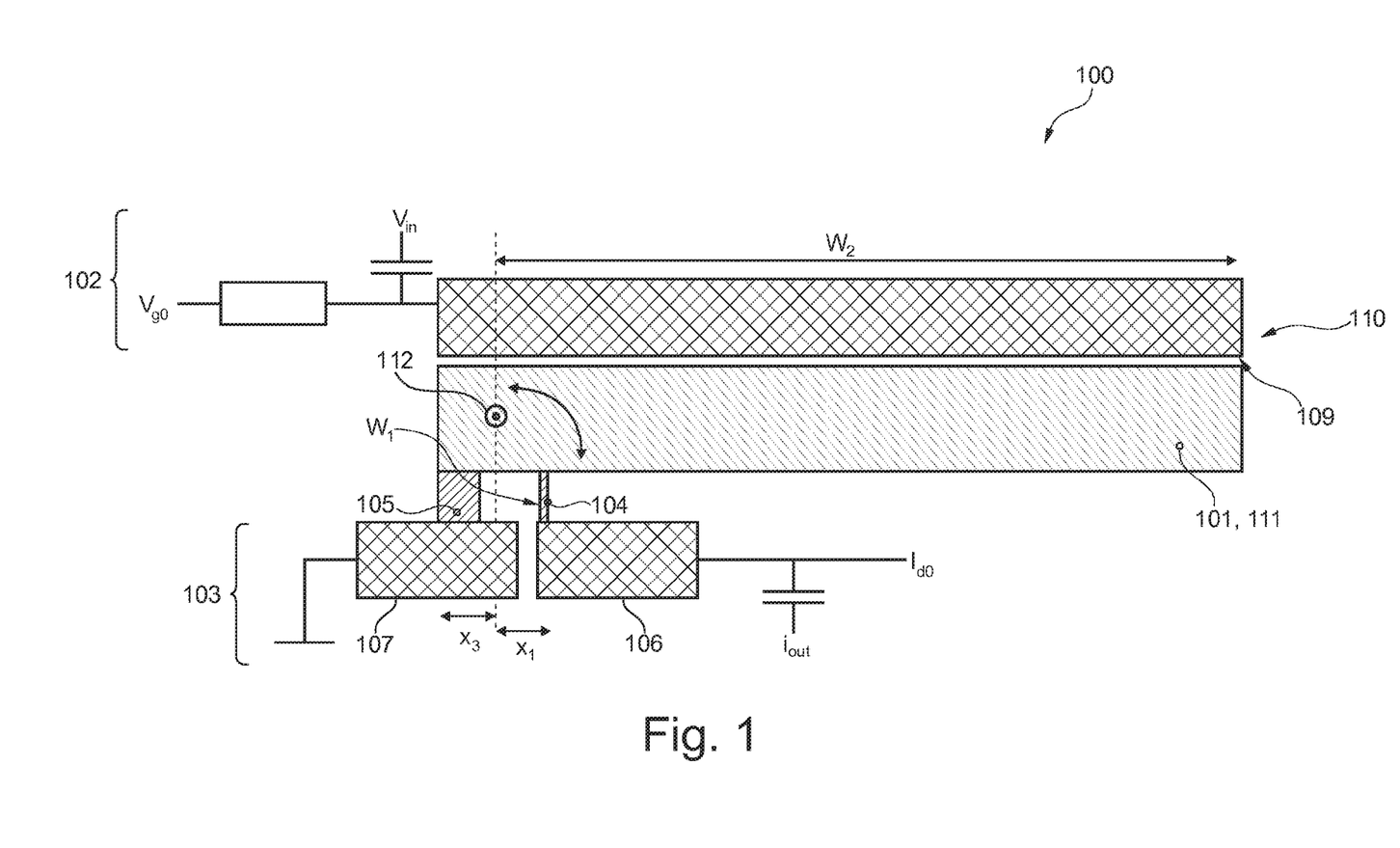
FIG. 1 illustrates a scheme of an electromechanical transducer according to one embodiment of the present invention.

FIG. 1 illustrates an exemplary embodiment of the present invention. The electromechanical transducer 100 shown in FIG. 1 comprises a cantilever beam 101 and an excitation unit 102 that is adapted for exciting a motion of the cantilever beam 101. A detection unit 103 is adapted for detecting an electrical signal $i_{out}$ in response to the excited motion of the cantilever beam 101.

Furthermore, a compressible piezo-resistive element 104 and a stretchable piezo-resistive element 105 is shown in FIG. 1. The compressible piezo-resistive element 104 and the stretchable piezo-resistive element 105 are adapted for clamping or flexibly securing the cantilever beam 101 to the detection unit 103. The excitation unit 102 comprises an excitation area 109 that provides an excitation voltage $v_{in}$ to the cantilever beam 101. In another exemplary embodiment it is also possible to apply a bias voltage $V_{g0}$ to the excitation unit 102, wherein the excitation voltage $v_{in}$ is additionally applied or overlaid to the detection unit 103. If the sum of the bias voltage $V_{g0}$ and the excitation voltage $v_{in}$ includes a resonance frequency of the cantilever beam 101, the cantilever beam 101 moves with the excited motion as indicated by the curved arrows in FIG. 1.

The cantilever beam 101 is clamped to the detection unit 103 by the compressible piezo-resistive element 104 and/or the stretchable piezo-resistive element 105. As shown in FIG. 1, the cantilever beam 101 may rotate around a rotary axis 112 and therefore compresses the compressible piezo-resistive element 104 or stretches the stretchable piezo-resistive element 105. Therefore, the resistance of the piezo-resistive elements 104, 105 may be changed due to the excited motion of the cantilever beam 101 so that a specific electrical signal $i_{out}$ is provided.

To the detection unit 103 a bias current $I_{d0}$ may be applied. The bias current $I_{d0}$ may flow through the compressible piezo-resistive elements 104 and/or the stretchable piezo-resistive element 105. If the resistance of the piezo-resistive elements 104, 105 is changed, this change in resistance may also change the electrical signal $i_{out}$. Due to the relation between the (mechanical) elongation and shortening of the piezo-resistive elements 104, 105 with the resistance, the electrical signal $i_{out}$ depends on the excited motion of the cantilever beam 101 and thus to the excited voltage $v_{in}$ of the excitation unit 102.

The excitation unit 102 provides an excitation area 109 and the cantilever beam 101 a leverage portion 111. Between the excitation area 109 and the leverage portion 111 an excitation gap 110 is provided. If the excitation area 109 and/or the leverage portion 111 is raised, and/or the gap is reduced also the force F1 of the cantilever beam 101 may be raised. Thus, by raising the area ratio over which the excitation force or the excitation voltage $v_{in}$ is applied to the cantilever beam 101, an improved electrical signal $i_{out}$ may be provided even if the excitation voltage $V_{in}$ is small.

Furthermore, in order to get a better change in resistance at the piezo-resistive elements 104, 105 at resonance and therefore an improved output electrical signal $i_{out}$, it is advantageous to concentrate the mechanical strain at locations where the electrical sense current, i.e. the compressible piezo-resistive element 104 and/or the stretchable piezo-resistive element 105, is applied. Therefore, the leverage effect of the cantilever beam 101 may be used to improve the electrical signal $i_{out}$ for small excitation voltages $V_{in}$. By using the cantilever beam 101 with the leverage portion 111, the excitation force F2 at the location where the resonance is sensed by the resistance change of the piezo-resistive elements 104, 105 may be amplified.

With other words, FIG. 1 illustrates an embodiment wherein the excitation force F2 is amplified resulting in reaction force F1 by the use of the leverage effect. As shown in the embodiment in FIG. 1, the cantilever beam 101 provides a rotary axis 112. In a first distance x1 to the rotary axis 112, the compressible piezo-resistive element 104 is positioned. In a second distance, namely the excitation distance x2, the point of application of the excitation force F2 is positioned. The equilibrium equations of the moments are therefore:

$$x_1 F_1 + x_2 F_2 = 0$$

Thus, when the excitation force F2 is small and the excitation distance x2 is long and the first distance x1 is small, the reaction force F1 which is the force that mechanically acts on the compressible piezo-resistive elements 104 is raised and therefore sufficient mechanical force is available to produce a change in resistance of the compressible piezo-resistive element 104 and gives therefore a useful electrical signal $i_{out}$.

A similar effect applies to the stretchable piezo-resistive element 105. The stretchable piezo-resistive element 105 is placed with a second distance x3 in the opposite direction of point of application of the excitation force F2. Therefore, the movement of the cantilever beam 101 due to the excitation force F2 leads to a stretching of the stretchable piezo-resistive element 105. If the second distance x3 is smaller than the excitation distance x2, the excitation force F2 will be amplified which results in the higher reaction force F1.

With other words, the resonator is excited by the excitation voltage $V_{in}$ e.g. an AC voltage, over the excitation gap 110. The cantilever beam 110 acts as a resonator and follows an excited motion as indicated by the curved arrow. The compressible piezo-resistive element 104 and the stretchable piezo-resistive element 105 connect the cantilever beam 101 to the detection unit 102 that may comprise or consist of a first anchor element 106 and a second anchor element 107. The piezo-resistive elements 104, 105 are stretched and compressed as a result of the excited motion of the cantilever beam 101. The elongation and shortening of the piezo-resistive elements 104, 105 is detected by measuring its piezo-resistance respectively its change in resistance.

Figure 1A:
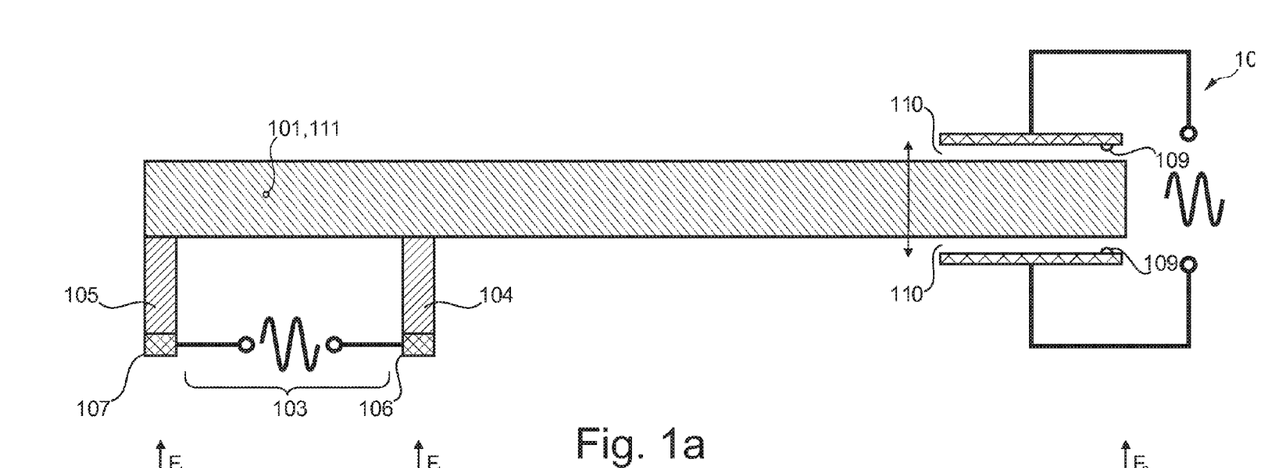
FIG. 1a illustrates a schematical view of a further exemplary embodiment of the electromechanical transducer.

FIG. 1a illustrates an exemplary embodiment of the electromechanical transducer 100, wherein the excitation unit 102 is located on the right first end 113 of the cantilever beam 101. The excitation unit 102 may comprise electrodes on both sides of the cantilever beam 101. The excitation area 109 is thus provided on the upper side and the lower side of the cantilever beam 101.

Figure 2:
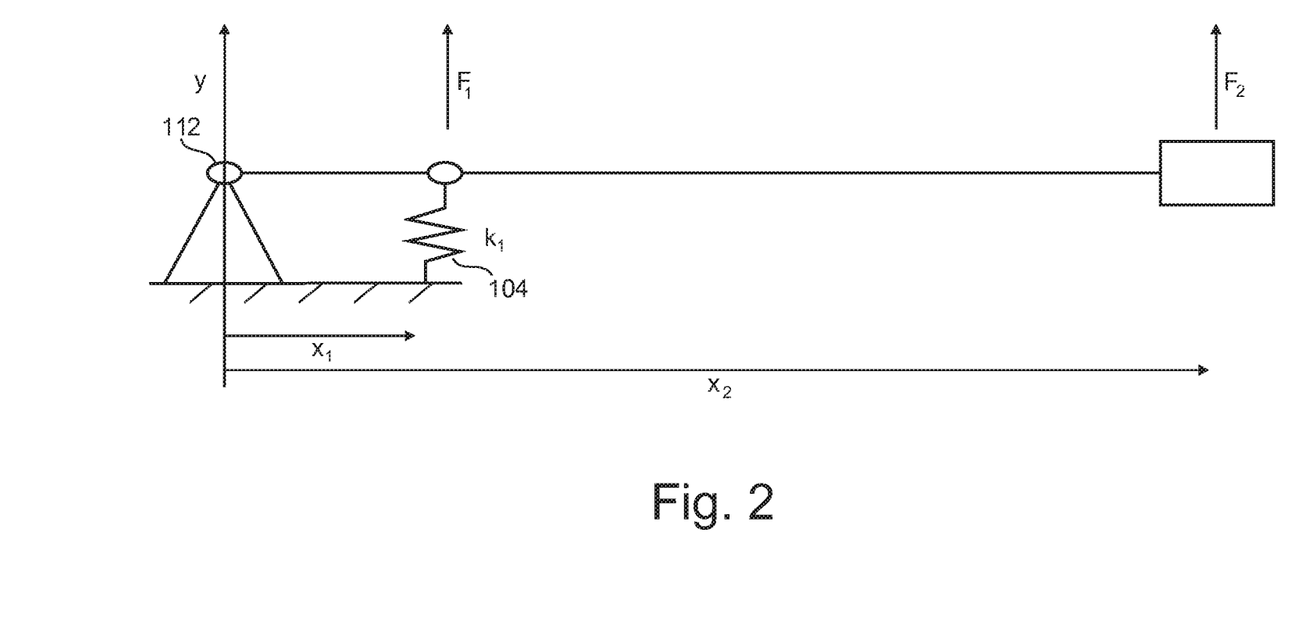
FIG. 2 illustrates a schematical view of a mechanical equivalent diagram of the exemplary embodiment of FIG. 1.

FIG. 2 illustrates a mechanical equivalent diagram that shows the amplifying effect of the embodiment of FIG. 1.

The excitation force F2 is applied to the cantilever beam 102 that results in a reaction force F1 at spring constant k1. Spring constant k1 is dependent on the material characteristics of the piezo-resistive elements 104, 105. The reaction force F1 provides a point of application with an excitation distance x2 to the rotary axis 112. In FIG. 2, the compressible piezo-resistive element 104 is shown and located in a first distance x1 to the rotary axis 112.

The equilibrium equation of moment is:

$$x_1 F_1 + x_2 F_2 = 0$$

Applying this equation to the equation of the excited motion of the cantilever beam 101 and the elongation y1 of spring k1, i.e. the elongation of the compressible piezo-resistive element 104, results in the following equation:

$$m_2 y_1'' \gamma y_1' + \left(\frac{x_1}{x_2}\right)^2 k_1 y_1 = \left(\frac{x_1}{x_2}\right) F_2$$

with damping factor $\gamma$ and mass m2. The resonance frequency and Q-factor are given by, $$\omega_0 = \frac{x_1}{x_2} \sqrt{\frac{k_1}{m_2}}$$

$$Q = \frac{x_1}{x_2} \frac{\sqrt{k_1 m_2}}{\gamma}$$

The maximum elongation y1, max at resonance is given by, $$y_{1,max} = \frac{Q F_2}{k_1} \frac{x_2}{x_1}$$

The spring constant k1 and excitation force F2 and leverage arm or excitation distance x2 are given by, $$k_1 = E \frac{w_1 h}{l}$$

$$F_2 = v_{in} V_{g0} \frac{\varepsilon_0 w_2 h}{g^2}$$

$$x_2 = w_2 / 2$$

And therefore the mechanical strain acting on the compressible piezo-resistive element 104 $\epsilon = y_1$, max/l at resonance of the cantilever beam 101 is, $$\varepsilon_{1,max} = v_{in} V_{g0} \frac{\varepsilon_0 Q}{2 E g^2} \frac{x_2}{x_1} \frac{x_2}{w_1}$$

The mechanical strain will result in a resistance change, dR/R due to the piezo-resistive effect, $$\frac{dR}{R} = K \varepsilon$$

with piezo-resistive Gauge factor K. When the resonator, i.e. the cantilever beam 101, is biased with a current $i_{d0}$ then the modulated current, i.e. the electrical signal $i_{out}$, over the excitation voltage $v_{in}$ at resonance is given by:

$$\frac{i_{out}}{v_{in}} = I_{d0}V_{g0}\frac{\varepsilon_0 K}{2E}\frac{Q}{g^2}\frac{x_2}{x_1}\frac{x_2}{w_1} = I_{d0}V_{g0}\frac{\varepsilon_0 K}{2E}\frac{Q}{g^2}\eta_{arm}\eta_{area}$$

The ratio $$gm = i_{out}/v_{in}$$

should be maximized for instance in filter and oscillator applications. This may be done by increasing $\eta_{area}$ area, e.g. by increasing the excitation area 109 or the leverage portion 111. However, also the lever effect may be used to increase the change in resistance of the sensing elements, i.e. the piezo-resistive elements, so that $\eta_{arm}$ arm may be used to increase gm.

Figure 2A:
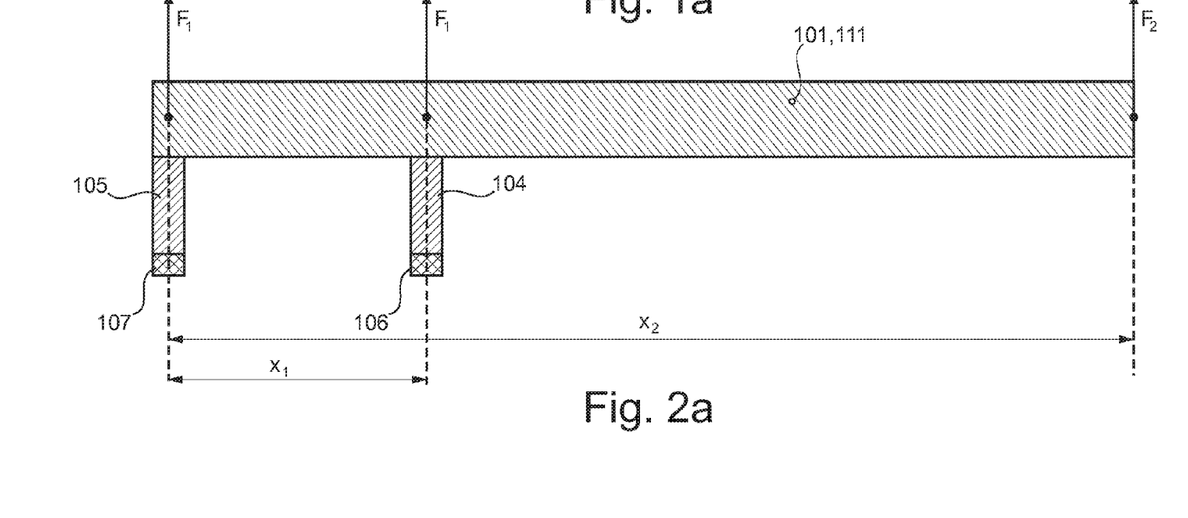

FIG. 2a illustrates a mechanical equivalent diagram that shows the amplifying effect of the embodiment of FIG. 1a. To the first end 113 of the cantilever beam 101, the point of application of the excitation force F2 is shown. At the location of the compressible and stretchable piezo-resistive elements 104, 105 the point of application of the reaction force F1 is shown. The mathematical relation between the excitation force F2 and the reaction force F1 may similar to the exemplary embodiment of FIG. 1:

$$x_1 F_1 + x_2 F_2 = 0$$

Figure 3:
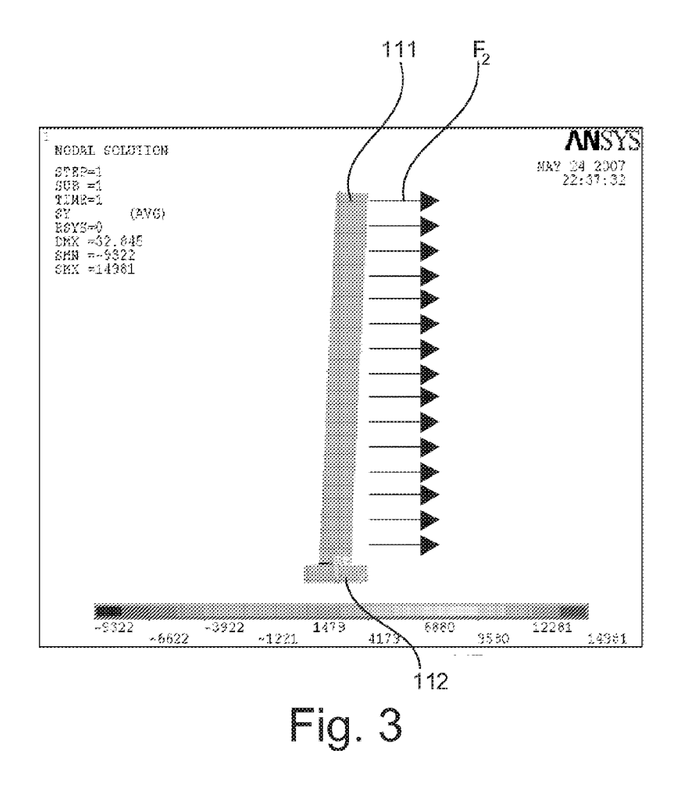
FIG. 3 illustrates a schematical view of a FEM analysis of the deformation of the cantilever beam according to an exemplary embodiment of the invention.
Figure 4:
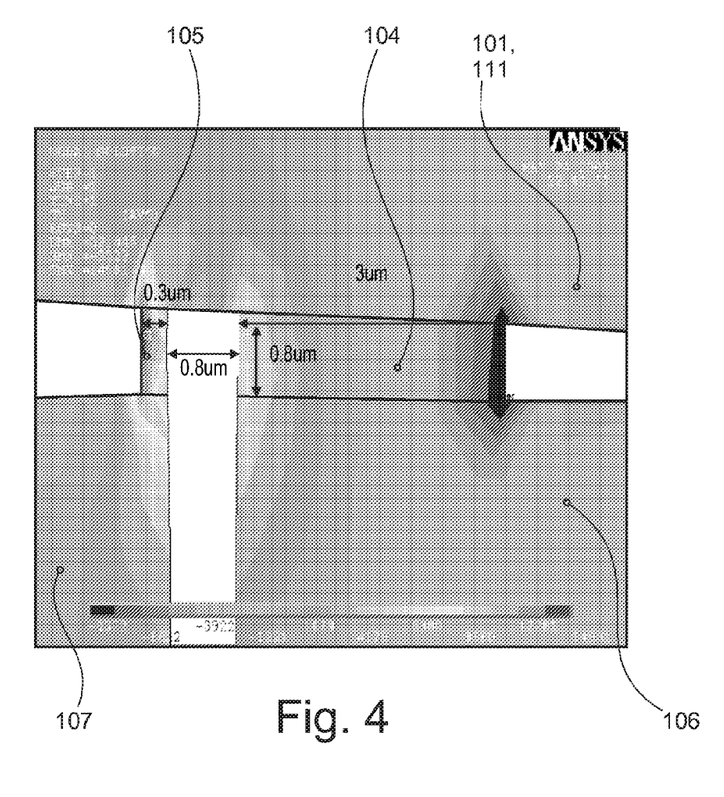
FIG. 4 illustrates a schematical and detailed view of the exemplary embodiment of FIG. 3.

FIG. 3 to FIG. 6 illustrate results of a finite element analysis. In the analysis so far it may be assumed that the cantilever beam 101 is perfectly flexible in rotation and the leverage portion 111 is perfectly rigid. In order to validate these assumptions the finite element analysis is carried out. A top view of the resonator, i.e. cantilever beam 101, is illustrated in FIG. 3. A zoom-in of the sense bars, i.e. the piezo-resistive elements 104, 105, and an enlarged view of the resonator's joint, i.e. the cantilever beam 101, is illustrated in FIG. 4. The narrow bar, e.g. the compressible piezo-resistive element 104, is used for piezo-resistive sensing. In this case the leverage portion 111 may be in parallel with the springs, but is again equivalent to the mass-spring system depicted in FIG. 2. The resonance frequency of this particular structure of the cantilever beam 101 may be for instance in the range between 150 to 180, 160 to 170 kHz (Kilohertz or as shown in FIG. 3 to FIG. 6 around 162 kHz assuming material properties of (100) oriented mono-crystalline Si. The excitation force F2 is set at around 1 N applied over the 200 μm long resonator edge, i.e. the leverage portion 111 of the cantilever beam 101.

From FIG. 4 it can be seen that indeed strain is concentrated in the narrow bar, e.g. the compressible piezo-resistive element 104, but also some opposite strain may be observed in the wide bar, e.g. the stretchable piezo-resistive element 105. The stress profile over the width of the narrow bar, e.g. the compressible piezo-resistive element 104, is illustrated in FIG. 5 and FIG. 6.

Figure 5:
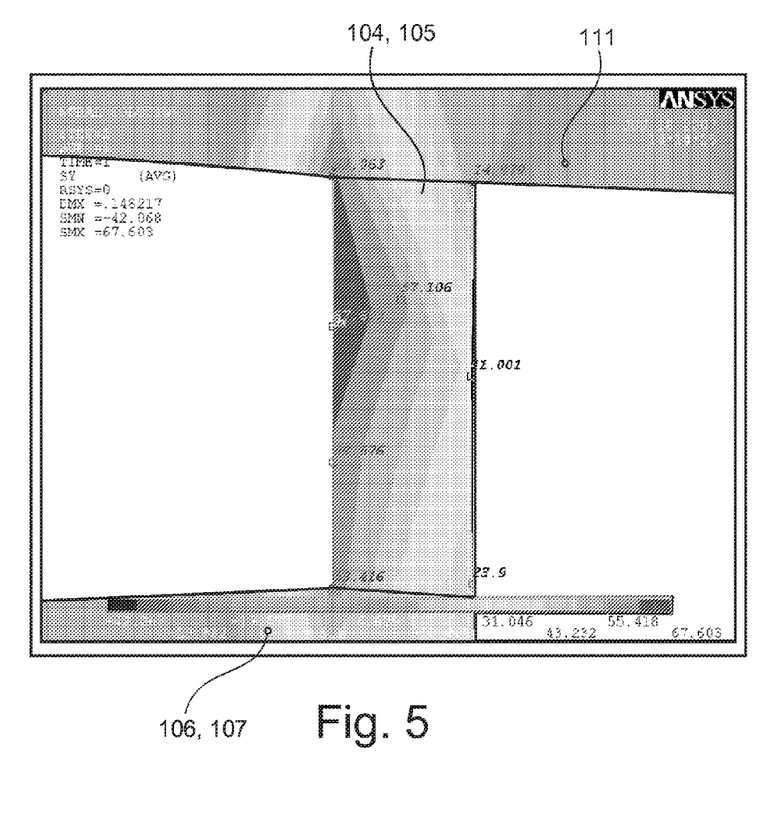
FIG. 5 illustrates an enlarged view of an FEM analysis of the exemplary embodiment of FIG. 4.

FIG. 5 illustrates a zoom in of the stress distribution in y-direction of sensing element, i.e. the compressible piezo-resistive element 104.

Figure 6:
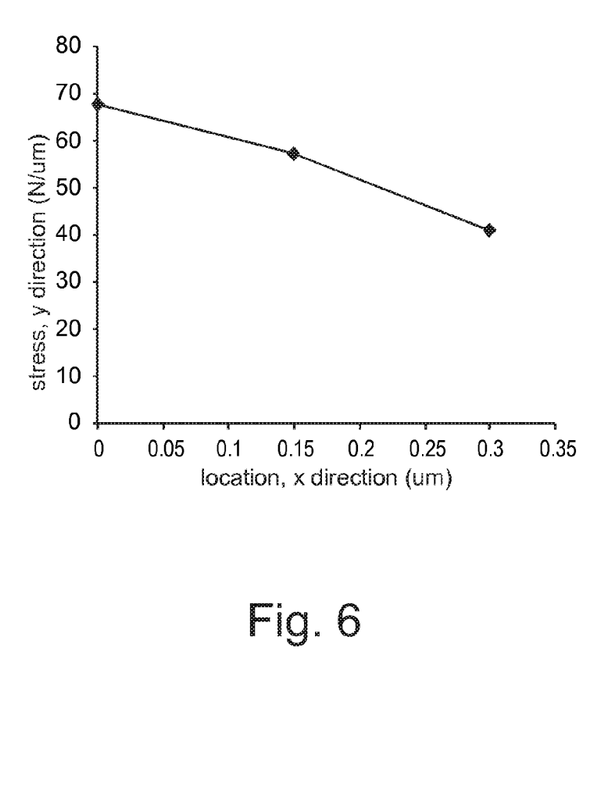
FIG. 6 illustrates a diagram of the stress direction of an FEM analysis in relation to the location of the cantilever beam according to an exemplary embodiment of the present invention.

FIG. 6 illustrates a stress distribution in y-direction as function of an x-position taken halfway the bar, e.g. the piezo-resistive element 104, 105.

From this graph it can be seen that the average stress is approximately 55.2 N/μm. This translates into a lever action $\eta_{arm}$=16.6 taking into account the bar width of 0.3 μm. From the geometry is can be seen x1=2.45 μm and x2=100 μm and therefore the lever action as predicted by the spring-mass model is $\eta_{arm}$=40.8. The fact that the simulated $\eta_{arm}$ is lower than the calculated one is due to the fact that the point of rotation has a finite bending stiffness and therefore part of the excitation force F2 is screened by the force F1 needed to bend the wide bar, e.g. the stretchable piezo-resistive element 105, into its final shape.

Figure 7:
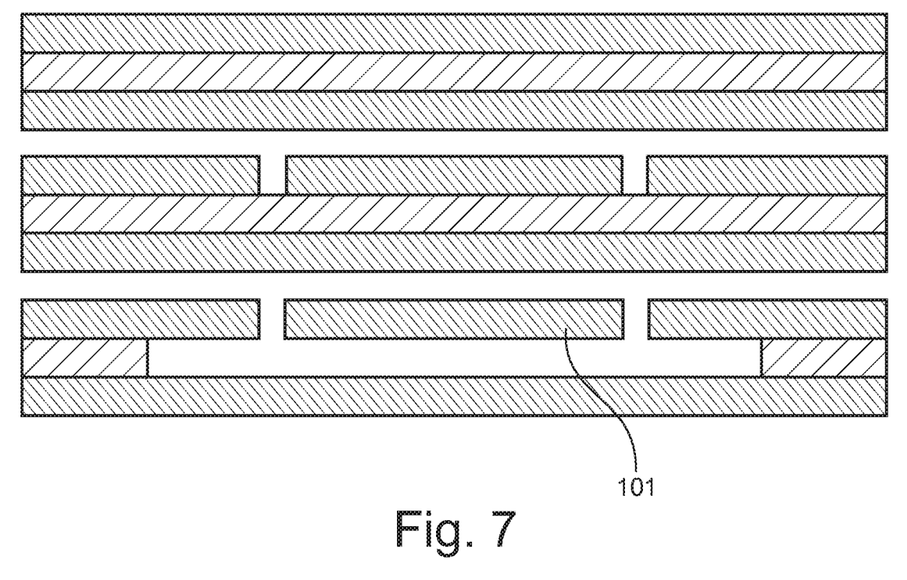
FIG. 7 illustrates an exemplary view of a layer structure of a MEMS according to an exemplary embodiment of the present invention.

FIG. 7 illustrates the electromechanical transducer that is made on a silicon substrate. An exemplary method of how to build and use the electromechanical transducer may be similar to a method for making MEMS resonators (three cross-sectional drawings of the substrate). Starting material may be a silicon-on-insulator wafer (SOI). The resonator layout, i.e. the cantilever beam 101 layout, may be etched in SOI layers. The resonator, i.e. the cantilever beam 101, may then be released by isotropic etching of buried oxide layer (BOX). In FIG. 7, the exited motion of the resonator, i.e. of the cantilever beam 101, is in the plane of the substrate.

The manufacturing method may be carried out in CMOS technology, since the described procedures are compatible with CMOS technology.

For any method step, any conventional procedure as known from semiconductor technology may be implemented. Forming layers or components may include deposition techniques like CVD (chemical vapour deposition), PECVD (plasma enhanced chemical vapour deposition), ALD (atomic layer deposition), or sputtering. Removing layers or components may include etching techniques like wet etching, vapour etching, etc., as well as patterning techniques like optical lithography, UV lithography, electron beam lithography, etc.

The structure may be formed on a purely crystalline silicon wafer or on an SOI wafer (Silicon On Insulator). Any process technologies like CMOS, BIPOLAR, BICMOS may be implemented.

FIG. 8a to FIG. 8d illustrate exemplary embodiments of the compressive piezo-resistive elements 104 and the stretchable piezo-resistive elements 105. Further exemplary embodiments may be provided by modifying the doping in the stressed beams, i.e. the compressive piezo-resistive elements 104 and the stretchable piezo-resistive elements 105.

Different types of doping can be diffused in the compressive piezo-resistive elements 104 and the stretchable piezo-resistive elements 105 that may consist of an SOI layer, for instance. In this way, positive as well as negative values for the piezo-resistive Gauge factor can be provided.

Figure 8A:
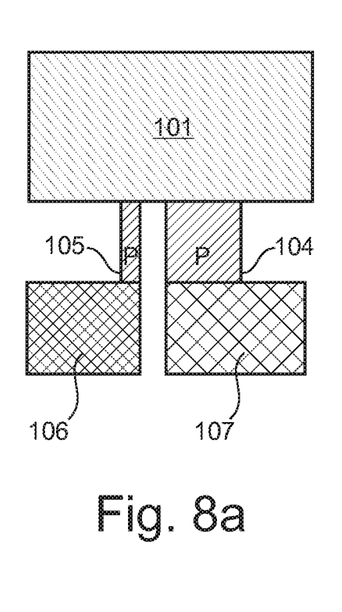
FIG. 8A to FIG. 8D illustrate a schematical view of piezo-resistive elements that are doped differently according to exemplary embodiments of the present invention.

FIG. 8a illustrates piezo-resistive elements 104, 105 and that are both doped identically. In that case the induced resistance change is opposite for both piezo-resistive elements 104, 105. Thus, either one of the piezo-resistive elements 104, 105 is a compressive piezo-resistive element 104 and a stretchable piezo-resistive element 105 or the widths of the piezo-resistive elements 104, 105 are made unequal in order to get a net output electrical signal $i_{out}$. For instance, the resistance and the strain in the wide bar, e.g. stretchable piezo-resistive element 105, may be reduced and therefore the output signal is dominated by the narrow bar, e.g. the compressible piezo-resistive element 105.

Figure 8B:
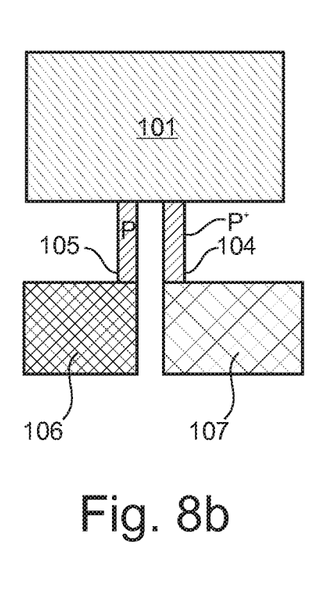

FIG. 8b illustrates an embodiment wherein both bars, i.e. both piezo-resistive elements 104, 105, are doped differently (e.g. one p-type, the other n-type) or the dopant concentration is different (e.g. one p and other p++, or one n and the other n−−), then both piezo-resistive elements 104, 105 may have the same geometry. In case both piezo-resistive elements 104, 105 are doped at different levels as shown in FIG. 8b, the piezo-resistive element 104, 105 with low doping level may be dominate the response.

Figure 8C:
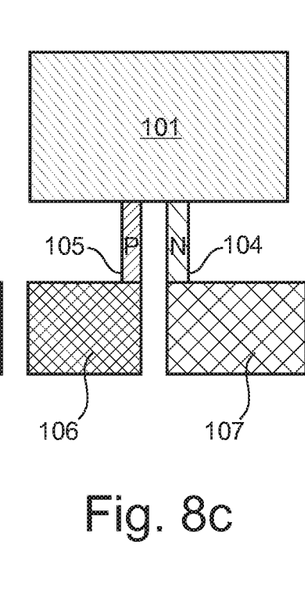

When both piezo-resistive elements 104, 105 are doped with different type of dopants, as shown in FIG. 8c, the overall resistance change is the sum of both piezo-resistive elements 104, 105, since one piezo-resistive element 104, 105 will increase/decrease resistance under compression and the other will increase/decrease resistance when stretched. This is due to the fact that piezo-resistive effect is opposite for n-type and p-type Si, for instance.

Figure 8D:
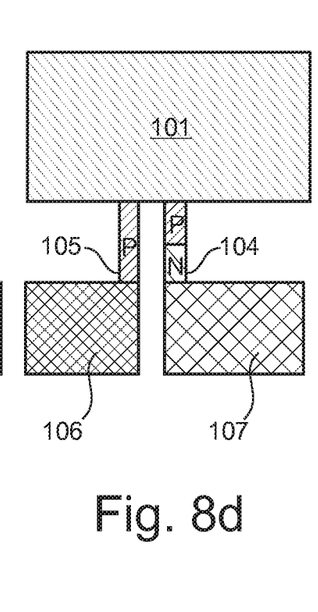

FIG. 8d shows a geometry where one of the piezo-resistive elements 104, 105 incorporates a p-n-junction. In this case, the piezo-junction is used for sensing instead of the piezo-resistive effect. When the junction is biased in reverse, the resistance through the joint is dominated by the junction and therefore mainly the piezo-junction effect is detected.

Thus, the lever action can be used to increase the change in resistance of the compressible and stretchable piezo-resistive elements 104, 105.

Figure 9:
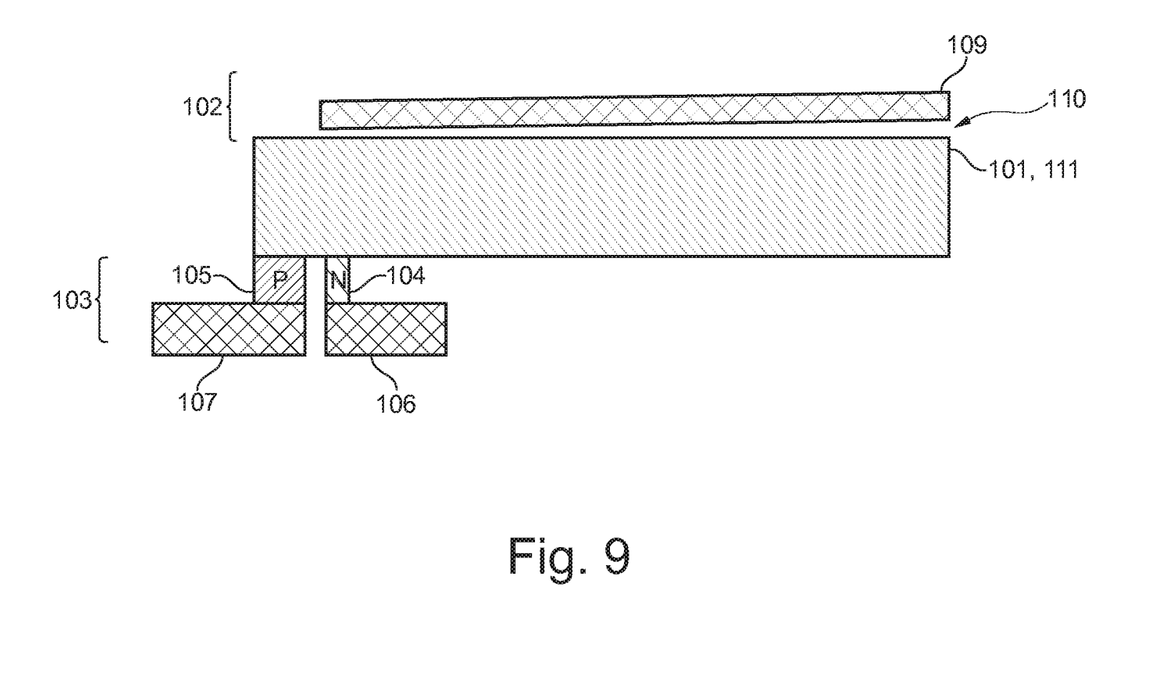
FIG. 9 illustrates a schematical view of an electromechanical transducer including an excitation gap with a varying distance according to an exemplary embodiment of the present invention.

FIG. 9 illustrates an exemplary embodiment of the electromechanical transducer, wherein the excitation gap 110 provides an inconstant spacing between the length of the cantilever beam 101 and the excitation area 109. The width of the excitation gap 110 decreases towards the suspended end of the resonating beam or the cantilever beam 101. This may provide the advantages of a larger mechanical amplitude with lower actuation voltage. The gap can also be comb-shaped. This may further increase the excitation gap 110 and may linearize the excitation force F2 as a function of displacement.

Figure 10:
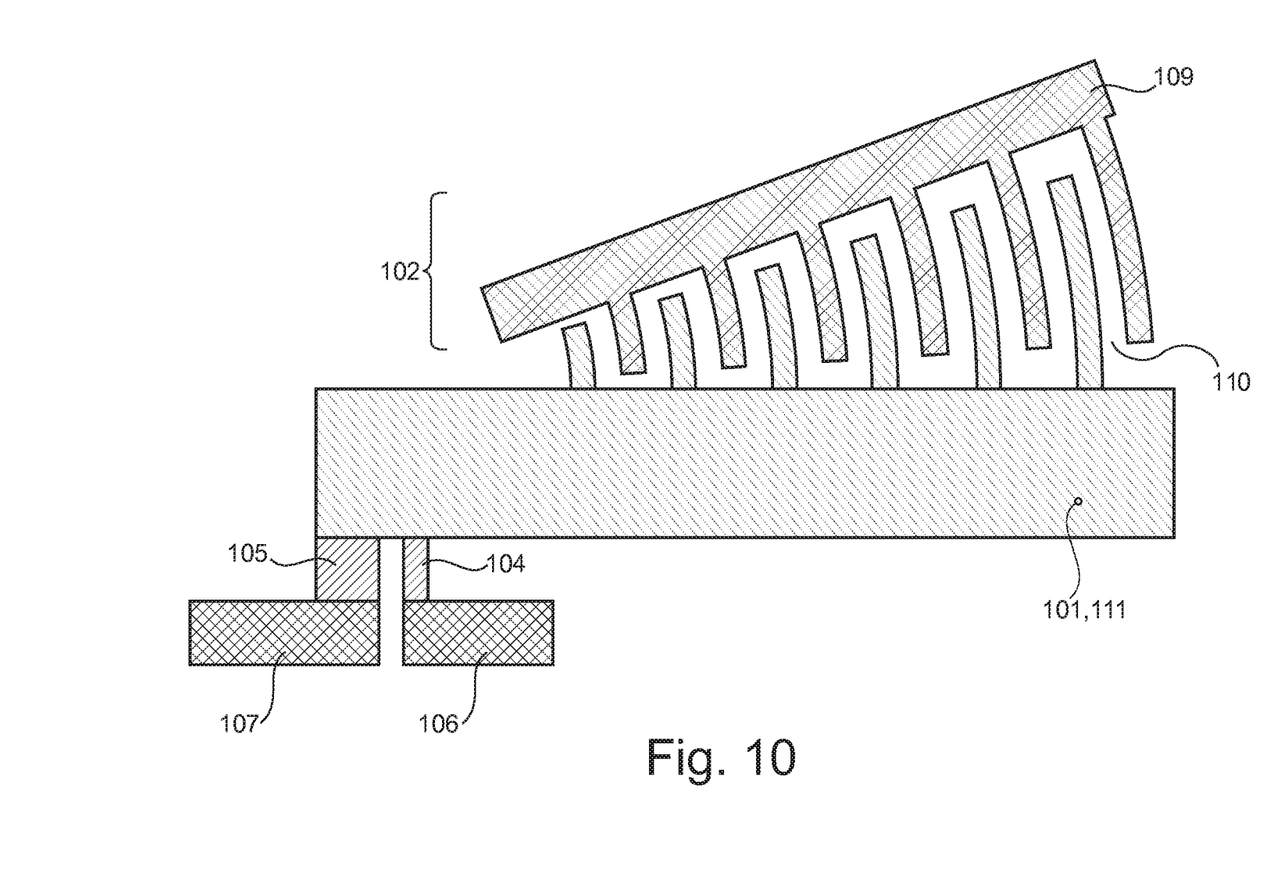
FIG. 10 illustrates a schematical view of an electromechanical transducer including a comb-shaped excitation area system according to an exemplary embodiment of the present invention.

FIG. 10 illustrates an exemplary embodiment of a comb-shaped excitation area 109. The comb-shaped excitation area 109 comprises jag elements that extrudes from the excitation area 109 in the direction to the cantilever beam 101. The cantilever beam 101 comprises respective jags that extrudes from the surface of the cantilever beam 101 in the direction to the excitation area 109. The jag elements of the cantilever beam 101 are adapted for meshing with the jag elements of the comb-shaped excitation area 109 without contacting each other. Between the jag elements of the comb-shaped excitation area 109 and the jag elements of the cantilever beam 101 an excitation gap 110 is still provided. Thus, the excitation gap 110 forms a comb-shape by the jags of the cantilever beam 101 and of the excitation area 109. Thus, the overall excitation area 109 may be increased without lengthen the cantilever beam 101 or the excitation unit 102.

Figure 11:
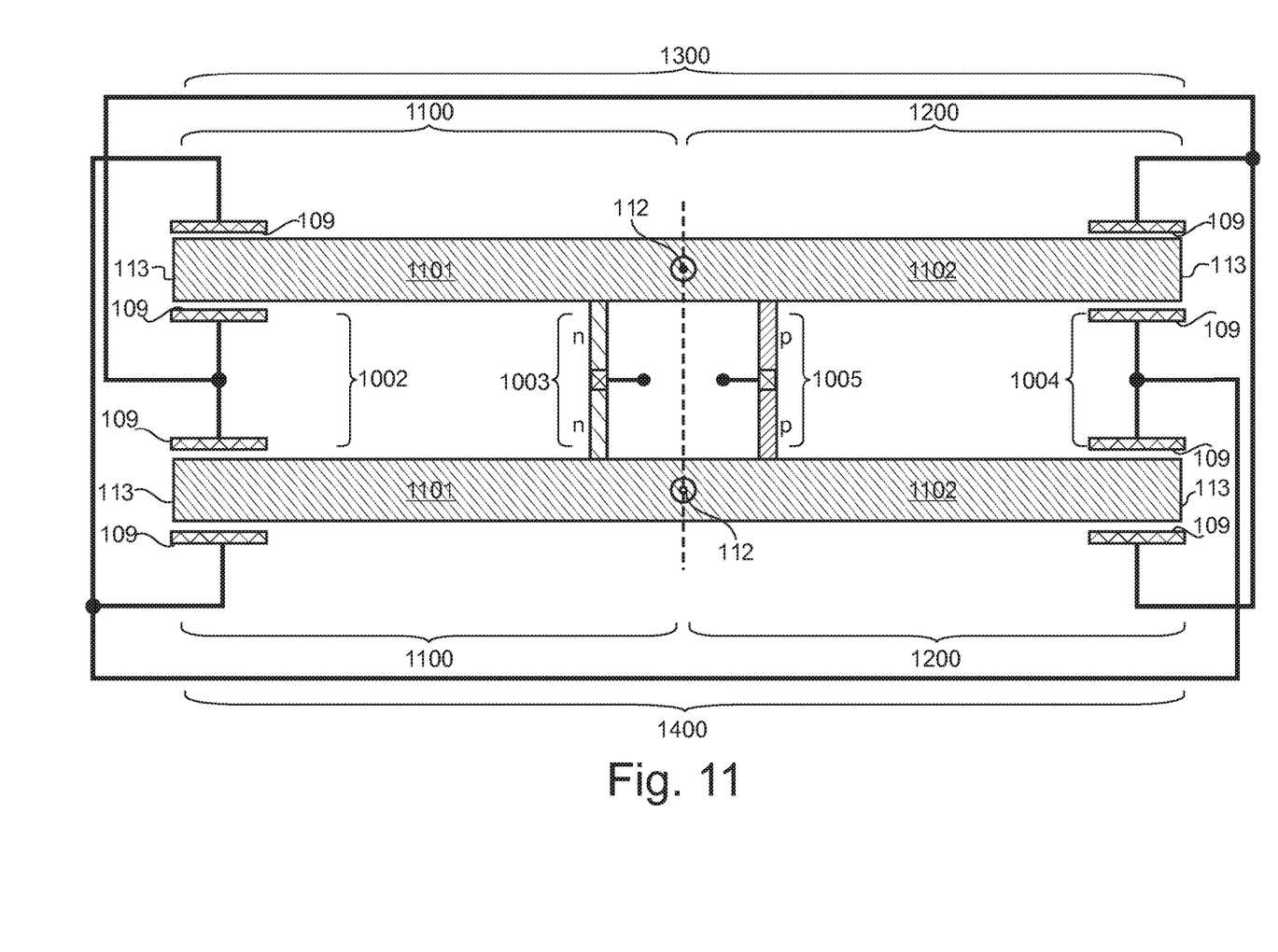
FIG. 11 illustrates a schematical view of the electromechanical transducer system and the multiple electromechanical transducer system according to an exemplary embodiment of the present invention.

FIG. 11 illustrates an exemplary embodiment of the electromechanical transducer system and the multiple electromechanical transducer system. In FIG. 11, a first electromechanical transducer system 1300 and a second electromechanical transducer system 1400 are shown. The first and second electromechanical transducer systems 1300, 1400 each comprise a first electromechanical transducer 1100 and a second electromechanical transducer 1200. Each electromechanical transducer 1100, 1200 comprises a first and second cantilever beam 1101, 1102. The first and second cantilever beams 1101, 1102 are connected by common rotary axis 112. The exciting motion of the first cantilever beam 1101 and the second cantilever beam 1102 provides the same rotary excited motion around one common rotary axis 112. In a first distance x1 and a second distance x3 the compressible piezo-resistive elements 104 and the stretchable piezo-resistive elements 105 are located. The piezo-resistive elements 104, 105 may be compressible and/or stretchable depending on the excited motion of the first and second cantilever beams 1101, 1102. On the first ends 113 of the cantilever beams 1101, 1102 the first and second common excitation units 1002, 1004 are provided. The first and second excitation units 1002, 1004 may comprise electrodes on both sides of the first and cantilever beams 1101, 1102. If the electrodes are located along both sides of the first and second cantilever beams 1101, 1102, the actuation signal or the excitation voltage $V_{IN}$ may be 180° out of phase. This may provide the effect that a lower driving voltage may be needed.

In an exemplary embodiment, the first cantilever beams 1101 may comprise a first common excitation unit 1002 and the second cantilever beams 1102 may comprise a second common excitation unit 1004. Furthermore, in another exemplary embodiment, the first common excitation unit 1002 and the second common excitation unit 1004 interact with each other. For example, each of the first common excitation units 1002 and the second common excitation units 1004 comprises electrodes that are located to an inner side and electrodes that are located to an outer side of each cantilever beam 1101, 1102. The electrodes that are located to the inner side of the first cantilever beams 1101 receive the same excitation voltage $V_{IN}$, such as the same frequency or intensity, as the outer electrodes of the second cantilever beams 1102. Hence, the electrodes that are located to the outer side of the first cantilever beams 1101 may receive the same excitation voltage $V_{IN}$ as the inner electrodes of the second cantilever beams 1102. Thus, complex control devices for adjusting the excitation voltage $V_{IN}$ may be needless.

Furthermore, FIG. 11 shows a multiple electromechanical transducer system wherein two electromechanical transducer systems 1300, 1400 are coupled together and therefore using a first common excitation unit 1002 and/or a second common excitation unit 1004 and a first common detection unit 1003 and/or a second common detection unit 1005. Hence, a first common excitation unit 1002 and/or a second common excitation unit 1004 may excite either the excited motion of the first or the second cantilever beams 1101 and 1102.

By the movement of the first and second cantilever beam 1101, 1102 of the first and second electromechanical transducer 1101, 1102 common piezo-resistive elements 104, 105 may be elongated and measured with one common detection unit 1003, 1005.

Furthermore, FIG. 11 illustrates first and second cantilever beams 1101, 1102 of first and second electromechanical transducer 1100, 1200 in a first electromechanical transducer system 1300 and a second electromechanical transducer system 1400. The piezo-resistive elements 104 that connect the first cantilever beams 1101 and the piezo-resistive elements 105 that connect the second cantilever beams 1102 are doped differently.

With the electromechanical transducer an increase of the piezo-resistive output signal, i.e. the electrical signal $i_{out}$, of for instance a silicon resonator may be provided by using the leverage portion 111 of a cantilever beam 101 clamped by piezo-resistive elements 104, 105 on at least two well-chosen positions on the cantilever beam 101.

The application of the electromechanical transducer 100 may be suitable for MEMS based filters and oscillators. The claimed electromechanical transducer 100 will lower the bias current $i_{d0}$, the power consumption and the bias voltage $v_{g0}$ of such devices. The power levels required using the claimed electromechanical transducer 100 might allow for direct feed from a battery. This will greatly simplify the application in portable devices where oscillators, for instance, can be used for time keeping and frequency reference.

It should be noted that the term "comprising" does not exclude other elements or features and the "a" or "an" does not exclude a plurality. Also elements described in association with different embodiments may be combined.

It should also be noted that reference signs in the claims shall not be construed as limiting the scope of the claims.

REFERENCE NUMERALS 100 electromechanical transducer
101 cantilever beam 102 excitation unit
103 detection unit
104 compressible piezo-resistive element
105 stretchable piezo-resistive element
106 first anchor element
107 second anchor element
108 anchor gap
109 excitation area
110 excitation gap
111 leverage portion
112 rotary axis
113 first end
1002 first common excitation unit
1003 first common detection unit
1004 second common excitation unit
1005 second common detection unit
1100 first electromechanical transducer
1200 second electromechanical transducer
1101 first cantilever beam of the first electromechanical transducer
1102 second cantilever beam of the second electromechanical transducer
1300 first electromechanical transducer system
1400 second electromechanical transducer system
$V_{g0}$ bias voltage
$V_{in}$ excitation voltage
$i_{d0}$ bias current
$i_{out}$ electrical signal
F1 reaction force
F2 excitation force
x1 first distance
x2 excitation distance
x3 second distance
w1 length of piezo-resistive element
w2 length of leverage portion
k spring constant

The invention claimed is:

1. An electromechanical transducer, comprising:
   a cantilever beam;
   an excitation unit adapted for exciting a motion of the cantilever beam; and
   a detection unit adapted for detecting an electrical signal in response to the excited motion of the cantilever beam;
   a compressible piezo-resistive element;
   wherein the compressible piezo-resistive element is adapted for clamping the cantilever beam to the detection unit; and
   wherein the cantilever beam is adapted for compressing the compressible piezo-resistive element due to the excited motion of the cantilever beam such that the compressible piezo-resistive element provides the electrical signal to the detection unit.

2. The electromechanical transducer of claim 1, further comprising:
   a stretchable piezo-resistive element;
   wherein the stretchable piezo-resistive element is adapted for clamping the cantilever beam to the detection unit; and
   wherein the cantilever beam is adapted for stretching the stretchable piezo-resistive element due to the excited motion of the cantilever beam such that the stretchable piezo-resistive element provides the electrical signal to the detection unit.

3. The electromechanical transducer of claim 1;
   wherein the excitation unit is adapted for applying an excitation voltage over an excitation gap to affect the cantilever beam.

4. The electromechanical transducer of claim 3;
   wherein the cantilever beam comprises a leverage portion extending from a rotary axis of the cantilever beam to a first end of the cantilever beam;
   wherein the excitation unit is adapted for applying the excitation voltage to affect the leverage portion for generating a resulting excitation force acting on the cantilever beam; and
   wherein a resulting point of application of the excitation force is provided in an excitation distance to the rotary axis.

5. The electromechanical transducer of claim 4;
   wherein the compressible piezo-resistive element is provided in a first distance to the rotary axis of the cantilever beam;
   wherein the excitation distance and the first distance extend in an equivalent direction along the leverage portion; and
   wherein the excitation distance is greater than the first distance.

6. The electromechanical transducer of claim 4;
   wherein the stretchable piezo-resistive element is provided in a second distance to the rotary axis;
   wherein the excitation distance and the second distance extend in a different direction along the leverage portion; and
   wherein the excitation distance is greater than the second distance.

7. The electromechanical transducer of claim 1;
   wherein the detection unit comprises a first anchor element and a second anchor element;
   wherein the first anchor element and the second anchor element are arranged in such a way that an anchor gap is provided between the first anchor element and the second anchor element;
   wherein the compressible piezo-resistive element is attached to the first anchor element; and
   wherein the stretchable piezo-resistive element is attached to the second anchor element.

8. The electromechanical transducer of claim 1;
   wherein at least one of the compressible piezo-resistive element and the stretchable piezo-resistive element is made with a material selected from n-type doped materials and p-type doped semiconductor materials.

9. The electromechanical transducer of claim 3;
   wherein the excitation gap provides an inconstant spacing between the length of the cantilever beam and an excitation area to which the excitation voltage is applicable.

10. The electromechanical transducer of claim 1;
    further comprising at least one piezo-resistive element, optionally, at least one of a plurality of compressible piezo-resistive and piezojunction elements and a plurality of stretchable piezo-resistive elements.

11. An electromechanical transducer system, comprising:
    a first and a second electromechanical transducer according to claim 1;
    wherein the exciting motion of a first cantilever beam of the first electromechanical transducer and the exciting motion of a second cantilever beam of the second electromechanical transducer is a rotary motion around a common rotary axis.

12. A multiple electromechanical transducer system, comprising:
    a first and a second electromechanical transducer system according to claim 11;
    wherein first electromechanical transducers of the first electromechanical transducer system and of the second electromechanical transducer system comprise a first common excitation unit and a first common detection unit;

wherein second electromechanical transducers of the first electromechanical transducer system and of the second electromechanical transducer system comprise a second common excitation unit and a second common detection unit.

13. The multiple electromechanical transducer system of claim 12;

wherein the compressible piezo-resistive elements of the first cantilever beams of the first electromechanical transducer system and the second electromechanical transducer system and the stretchable piezo-resistive elements elements of the second cantilever beams of the first electromechanical transducer system and the second electromechanical transducer system are doped differently.

14. An electromechanical transducing method, comprising:

exciting a motion of a cantilever beam; and detecting, with a detecting unit, an electrical signal, from a compressible piezo-resistive element clamping the cantilever beam to the detection unit, in response to the excited motion of the cantilever beam; and wherein the cantilever beam is adapted for compressing the compressible piezo-resistive element due to the excited motion of the cantilever beam such that the compressible piezo-resistive element provides the electrical signal to the detection unit.

\* \* \* \* \*